United States Patent
Jiang et al.

(10) Patent No.: US 7,707,527 B2
(45) Date of Patent: Apr. 27, 2010

(54) HUYGENS' BOX METHODOLOGY FOR SIGNAL INTEGRITY ANALYSIS

(75) Inventors: Lijun Jiang, Poughquag, NY (US);
Jason D. Morsey, Hopewell Junction, NY (US); Barry J. Rubin, Croton-on-Hudson, NY (US); Weng C. Chew, Champaign, IL (US); Mao-Kin Li, Urbana, IL (US); Yuan Liu, Champaign, IL (US)

(73) Assignees: International Business Machines Corporation, Armonk, NY (US); University of Illinois at Urbana_Champaign, Urbana, IL (US)

( * ) Notice: Subject to any disclaimer, the term of this patent is extended or adjusted under 35 U.S.C. 154(b) by 160 days.

(21) Appl. No.: 11/862,434

(22) Filed: Sep. 27, 2007

(65) Prior Publication Data
US 2009/0089021 A1    Apr. 2, 2009

(51) Int. Cl.
*G06F 17/50* (2006.01)
(52) U.S. Cl. ............... 716/4; 716/5; 716/6; 703/13; 708/446
(58) Field of Classification Search ............ 716/4–6; 703/13; 708/446
See application file for complete search history.

(56) References Cited

U.S. PATENT DOCUMENTS

| | | | | |
|---|---|---|---|---|
| 5,826,215 A * | 10/1998 | Garrett et al. | ................. | 702/75 |
| 6,513,001 B1 * | 1/2003 | Kapur et al. | .................. | 703/13 |
| 7,359,929 B2 * | 4/2008 | Tsang et al. | ................. | 708/446 |
| 2004/0001021 A1 * | 1/2004 | Choo et al. | .................. | 343/700 |
| 2005/0102343 A1 * | 5/2005 | Tsang et al. | ................. | 708/446 |
| 2007/0208547 A1 * | 9/2007 | Graglia et al. | ................. | 703/2 |
| 2008/0027689 A1 * | 1/2008 | Jandhyala et al. | .............. | 703/2 |
| 2008/0052337 A1 * | 2/2008 | Adams | ....................... | 708/446 |

OTHER PUBLICATIONS

Dietmar et al. "Use of Huygens source excitation in a MoM surface-current EFIE formulation"; International Symposium on vol. 3, Aug. 8-12, 2005; pp. 834-839.*

* cited by examiner

*Primary Examiner*—Naum B Levin
(74) *Attorney, Agent, or Firm*—Scully, Scott, Murphy & Presser, P.C.; Daniel P. Morris, Esq.

(57) ABSTRACT

A method for performing a signal integrity analysis on an integrated circuit (IC) that includes a plurality of scatterers by dividing the scatterers into subgroups using a nested Huygens' equivalence principle algorithm and solving a set of equations realized thereby with a reduced coupling matrix. The method includes decomposing the IC design into a plurality of small non-overlapping circuit sub-domains, wherein each of the sub-domains is formed as a small, enclosed region. Each sub-domain is analyzed independently of the other sub-domains using only electric fields to represent the interactions of each sub-domains with the other sub-domains as equivalent currents on equivalent surfaces of the plurality of sub-domains. Neighboring equivalent sub-domains are grouped together to form larger sub-domains using equivalent currents on equivalent surfaces to represent the interactions of the sub-domains. The steps of analyzing and grouping the sub-domains are repeated until the grouping approaches a box comprising the entire domain, and that the domain interactions between every sub-domain have been analyzed.

5 Claims, 1 Drawing Sheet

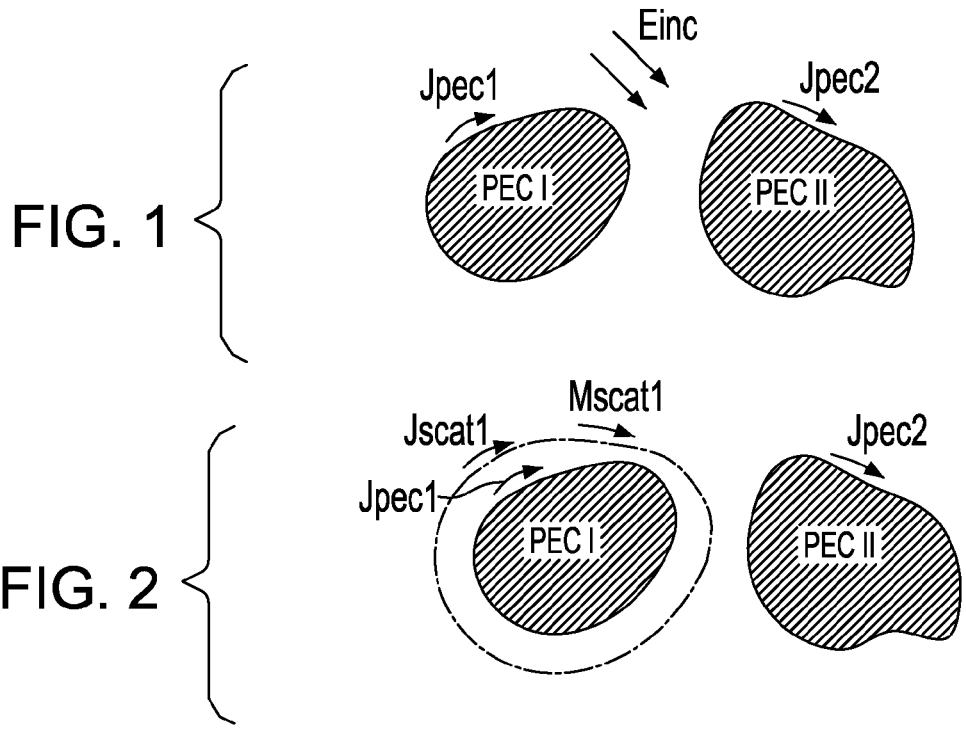
FIG. 1
FIG. 2
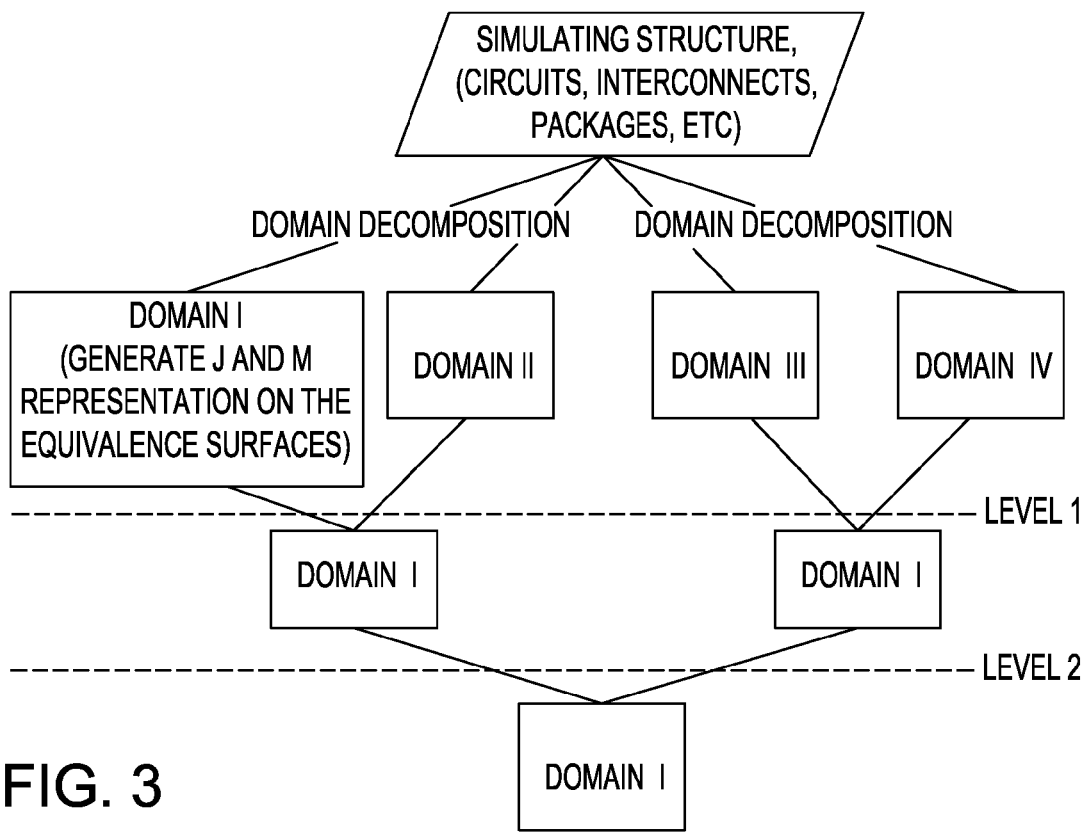
FIG. 3

HUYGENS' BOX METHODOLOGY FOR SIGNAL INTEGRITY ANALYSIS

BACKGROUND OF THE INVENTION

The invention relates to general electromagnetic simulation and electromagnetic field data processing for signal integrity analysis. More particularly, the invention relates to a method and computer system for solving complicated electromagnetic simulation problems in high-speed integrated circuit (IC) signal integrity analysis.

During electrical analyses of devices that are small with respect to wavelength, such as electronic packaging structures, chips, interconnects, and printed circuit boards, linear systems of equations must be solved. The present invention enhances existing electromagnetic simulation EDA tools using a novel Huygens' box methodology. The novel method and system requires use of only electric field integral equations (EFIE) instead of both EFIE and magnetic field integral equations (MFIE).

A Huygens' box approach to electromagnetic analysis of electronic structures includes constructing a large structure or domain from a set of smaller, non-overlapping sub-domains. The field property of the internal sub-domains are replaced with equivalent sources on the outer surfaces, i.e., discretized point sources. Each sub-domain is analyzed separately, without regard to the others. The method may be used enable conventional EDA tools to analyze complicated structures by compartmentalizing the problem into smaller equivalent units with fewer unknowns. As such, the present invention may serve as an industry standard to organize outputs from different electromagnetic vendor tools, generate parameterized model library databases, and in a readily parallelizable process.

A nested equivalence principle algorithm (NEPAL) that divides scattering objects into subgroups is known. W. C. Chew and C. C. Lu, "NEPAL—An Algorithm for Solving the Volume Integral Equation," Microwave and Optical Technology Letters, vol. 6, no. 3, pp 185-188, Mar. 5, 1993 ("Chew and Lu (1)"). For each subgroup, the NEPAL algorithm substitutes interior scatterers with boundary sub-scatterers using Huygens' equivalence principle. The subgroups are combined by levels to achieve a computational complexity of $O(N^2)$ for non-iterative solutions to 3D scattering problems. The NEPAL Algorithm, however, uses spherical point sources as the equivalent sources so that solving electromagnetic scattering of 3D objects using spherical wave manipulation is very complicated. W. C. Chew and C. C. Lu, "The Use of Huygens' Equivalence Principle for Solving the Volume Integral Equation of Scattering," IEEE Trans. Antennas and Propagat., vol. 41, no. 7, pp. 897-904, July 1993 ("Chew and Lu (2)"); and C. C. Lu and W. C. Chew, "The Use of Huygens' Equivalence Principle for Solving 3-D Volume Integral Equation of Scattering," IEEE Trans. Antennas and Propagat., vol. 43, no. 5, pp. 500-507, May 1995 ("Lu and Chew (3)").

Known alternative techniques include the use of a combination of surface integral equations, and apply a form of Huygens' equivalence principle. M.K. Li and W.C. Chew, "Wave-Field Interaction with Complex Structures Using Equivalence Principle Algorithm," UIUC CCEM Lab Research Report, 2006 ("Li and Chew (4)"), and M. K. Li, W. C. Chew and L.J. Jiang, "A Domain Decomposition Scheme to Solve Integral Equations Using Equivalent Surfaces," 2006 IEEE Antennas and Propagation Society International Symposium, pp. 2897-2900, Albuquerque, N.M., USA ("Li and Chew (5)."). These alternative techniques use both electric field and magnetic field to build the field response for an enclosed sub region to mimic the general [S] parameters. Boundary equivalent sources based on surface basis are used to preserve the sub region interactions. A nesting process similar to NEPAL is employed to combine sub regions. Since both EFIE (Electric Field Integral Equation) and MFIE (Magnetic Field Integral Equation) are involved, however, many operators are needed, rendering such an implementation process complicated.

Also known is a reduced-coupling method implemented to deduce the dense interactions through boundary ports. B. J. Rubin, A. Mechentel, and J. H. Magerlein, "Electrical Modeling of Extremely Large Packages," 1997 Electronic Components and Technology Conference, pp 804-809 ("Rubin (6)"); and US Pending Application Serial No. 2005/0222825 to Feldmann, et al., Method, Apparatus and Computer Program Providing Broadband Preconditioning Based on Reduced Coupling For Numerical Solvers ("the '825 application"). Rubin (6) and the '825 application accelerate the computational process, but not rigorously since the connecting boundaries are not closed.

OBJECTS AND SUMMARY OF THE INVENTION

In view of the shortcomings of the prior art, it is an object of the invention to realize a systematic mathematical methodology to partition electromagnetic simulation into smaller jobs that can be run much faster, using a less complicated technique or method.

It is another object to realize a methodology to join different electromagnetic field simulation processes, which processes maintain the physically correct wave-properties of any structure without any simplification.

It is another object of the invention to realize a physically and mathematically rigorous approach to replace conventional [S] parameter approximation currently widely used in the industry to solve scattering problems, and extend its application to much higher operating frequencies based on wave properties.

The invention is anticipated to be applied as an industry standard for pre-physical design (pre-PD) stage to unify outputs from different electromagnetic tools. The inventive method conveniently improves electric field integral equation (EFIE) based solvers for operation upon much more complicated structure simulations, providing a powerful tool to build customized libraries of models for re-use and for parameterization of general chip interconnects, and packaging design and analysis, as well as a simulation framework for fast computational algorithms including FFT, Fast Multipole Algorithm, and multi-grid method, etc. The invention further provides a methodology for use as a fast-preconditioner for iterative solutions, and readily parallelized on multiple server systems.

DESCRIPTION OF THE DRAWING FIGURES

FIG. 1 is a depiction of direct coupling interaction between two perfect electrical conductor (PEC) objects;

FIG. 2 is a depiction of the PEC objects of FIG. 1 wherein PEC I is enclosed in a Huygens' Equivalence Box, where PEC II is not; and FIG. 3 is a flowchart highlighting a whole solution domain decomposed into subdomains in accordance with a novel equivalence principle algorithm (EPA) of the invention.

DETAILED DESCRIPTION OF THE INVENTION

The invention includes a novel, simple and convenient methodology to implement the Huygens' Equivalence Principle algorithm using only electrical field integral equations (EFIE). The novel method may be treated as an extension of the reduced coupling method for implementing a rigorous solution. The novel method implements a variation on the NEPAL nesting scheme described in detail in Chew and Lu (1), Chew and Lu (2) and Lu and Chew (3), the Equivalence Principle Algorithm disclosed and described in Li and Chew (4) and Li and Chew (5), and implementation of reduced coupling method as described Rubin (6) and the '825 application.

The Huygens' Box Approach can be thought of as a mechanism for constructing a large structure, intended for electromagnetic analysis, from a set of smaller, non-overlapping regions. The Huygens' box approach is analogous to building a large model from Lego blocks, wherein each block is analyzed separately without regard to the others. That is, the equivalence boxes separate and enclose analyzed structures into small closed regions. The equivalent electric current and magnetic current on the EPA surfaces are formulated together with the realistic electric current and magnetic current on the conductor and dielectric surfaces. The blocks are combined through a mathematical procedure to reform the original structure. The interactions between different regions are forced to go through the closed surfaces of the boxes. A direct mapping of this interaction decomposition to a numerical model is defined by a set of surface integral equations, which are EFIE only in this method.

FIGS. 1 and 2 together highlight the coupling interaction between perfect electrical conductors (PECs) based on the Huygens' equivalence principle. FIG. 1 depicts direct coupling interaction or the scattering between two PEC objects, where FIG. 2 depicts the first PEC (PEC I of FIG. 1) enclosed in a Huygens' equivalent box. With PEC I enclosed as shown in FIG. 2, and where PEC II is not enclosed in a Huygens' equivalent box, the resultant MOM matrix is arranged as follows:

$$\begin{bmatrix} L_{11} & 0 & L_{11'} & K_{11'} \\ 0 & L_{22} & L_{21'} & K_{21'} \\ L_{1'1} & 0 & L_{11'} & K_{11'} \\ 0 & L_{1'2} & L_{11'} & K_{11'} \end{bmatrix} \begin{bmatrix} J_1 \\ J_2 \\ J_{1'} \\ M_{1'} \end{bmatrix} = \begin{bmatrix} 0 \\ -E_2^{inc} \\ -E_{1'}^{inc} \\ -E_{1'}^{inc} \end{bmatrix} \quad \text{Matrix (1)}$$

Since the matrix is highly sparse, numerous sparse matrix techniques can be used to optimize the process for solving Matrix (1). W. H. Press, S. A Teukolsky, W. T. Vetterling, and B. P. Flannery, "Numerical Recipes in C++: The Art of Scientific Computing," $2^{nd}$ Edition, Cambridge University Press, 2002. Because each of the coefficients has explicit physical meanings, Matrix (1) can be further reduced to a matrix problem in which the details inside the Huygens' box may be eliminated. Using the compression process, a much smaller matrix equation may be arranged as:

$$\begin{bmatrix} L_{22} & L_{21'} & K_{21'} \\ 0 & L_{1'1'} - L_{1'1}L_{11}^{-1}L_{11'} & K_{1'1'} - L_{1'1}L_{11}^{-1}K_{11'} \\ L_{1'2} & L_{1'1'} & K_{1'1'} \end{bmatrix} \quad \text{Matrix(2)}$$

$$\begin{bmatrix} J_2 \\ J_{1'} \\ M_{1'} \end{bmatrix} = \begin{bmatrix} -E_2^{inc} \\ -E_{1'}^{inc} \\ -E_{1'}^{inc} \end{bmatrix}$$

If both conductors PEC I and PEC II are enclosed inside different Huygens boxes, the matrix solution becomes:

$$\begin{bmatrix} L_{1'1'} & K_{1'1'} & L_{1'2'} & K_{2'2'} \\ L_{1'1'} - L_{1'1}L_{11}^{-1}L_{11'} & K_{1'1'} - L_{1'1}L_{11}^{-1}K_{11'} & 0 & 0 \\ L_{1'1'} & K_{1'1'} & L_{2'2'} & K_{2'2'} \\ 0 & 0 & L_{2'2'} - L_{2'2}L_{22}^{-1}L_{22'} & K_{2'2'} - L_{2'2}L_{22}^{-1}K_{22'} \end{bmatrix} \begin{bmatrix} J_{1'} \\ M_{1'} \\ J_{1'} \\ M_{2'} \end{bmatrix} = \begin{bmatrix} -E_{1'}^{inc} \\ -E_{1'}^{inc} \\ -E_{2'}^{inc} \\ -E_{2'}^{inc} \end{bmatrix} \quad \text{Matrix (3)}$$

which can be directly calculated based on Matrix (2). Therefore, if we want to discard the unknowns inside a Huygens' box, we can modify the interaction between the objects and the box using the following matrix equation coefficients:

$$L_{i'i'} \Rightarrow L_{i'i'} - L_{ii}L_{ii}^{-1}L_{ii'} \quad \text{Matrix (4)}$$

$$K_{i'i'} \Rightarrow K_{i'i'} - L_{ii}L_{ii}^{-1}K_{ii'}$$

Matrix (4) is derived by discarding the columns and rows related to the do-not-care unknowns. Matrix (2) and Matrix (3) are related to Lu and Chew (3) and Li and Chew (5), but obtained using different processes and therefore different operators.

The inventive method requires only using electric field instead of both electric and magnetic field calculations, resulting in a solution and recombination of the separate solutions in the reduced coupling matrix form as described in the pending '825 application. As a result, many interactions from the region boundaries are eliminated compared to the conventional direct methods. By eliminating region boundaries, formulation of the same physical process becomes much simpler and therefore faster. The corresponding storage becomes smaller, and solution speeds increase. The Huygens' Box nesting provides the overall strategy to solve complicated structures hierarchically, preserving the true field properties of the structure, unlike conventional [S] parameter based subdivisions. S parameters only interact through a few ports while the entire surface of the Huygens' Box preserves the field properties and interactions to the adjacent box.

In FIG. 3, the whole solution domain, such as a large interconnect network, electrical packages, etc., is shown decomposed into several sub-domains. Each sub-domain is solved independently at the lowest level and the solution is represented as equivalent currents on equivalent surfaces. Then, the neighboring equivalent surfaces are grouped together to form a larger box. The representation of the electromagnetic properties of the sub-domains includes equivalent currents that only reside on the equivalent surfaces. The process moves forward iteratively until the highest level is reached in which interactions between every part of the structure is considered.

The inventive method may be characterized as a full-wave approach. The inventive fill-wave approach is rigorous and therefore more accurate than conventional approximation methods. The computation of each sub-domain is isolated from the others, providing a natural interface to parallel computing. Aided by the power of parallel computers, the novel EPA-based system and method provides for efficient analysis of complex circuit structures. In the case of package modeling, templates are easily created for parameterized analysis. Each subdomain or template is constructed to be reused in a case where repetitive structures such as via arrays or fan-out wiring and very large structures are readily handled, regardless of variations of dimension.

What is claimed is:

1. A method for performing a signal integrity analysis on an integrated circuit (IC) comprising a plurality of scatterers by dividing the scatterers into subgroups using a nested Huygens' equivalence principle algorithm, and solving a set of equations realized thereby using a reduced coupling matrix, comprising the steps of:

decomposing the IC design into a plurality of small non-overlapping circuit sub-domains, wherein each of the sub-domains is formed as a small, enclosed region;

representing the interactions of each sub-domains with the other sub-domains as equivalent currents on equivalent surfaces of the plurality of sub-domains by using only electric field integral equations (EFIE) and without using any magnetic field integral equations (MFIE);

analyzing each sub-domain, independent of the other sub domains by analyzing said EFIEs;

grouping together neighboring equivalent sub-domains to form larger sub-domains using equivalent currents on equivalent surfaces to represent the interactions of the sub-domains; and repeating the steps of analyzing and grouping the sub-domains until the grouping approaches a box comprising the entire domain, and that the domain interactions between every sub-domain has been analyzed; and wherein the computation of each sub-domain is isolated from the others in order that the method is implemented using a parallel computing system.

2. The method as set forth in claim 1, implemented as an equivalence principle algorithm (EPA).

3. The method as set forth in claim 1, wherein the IC design includes an IC package design, and includes step of creating package design templates for parameterized analysis.

4. The method as set forth in claim 3, wherein each sub-domain or template is reused when comprising a repetitive structure.

5. The method as set forth in claim 1, wherein simulations may be performed at frequencies up to 10+ GHz.

* * * * *